(12) United States Patent
Byun

(10) Patent No.: US 11,269,542 B2
(45) Date of Patent: Mar. 8, 2022

(54) MEMORY SYSTEM FOR DISTRIBUTING AND READING DATA AND OPERATING METHOD THEREOF

(71) Applicant: SK hynix Inc., Gyeonggi-do (KR)

(72) Inventor: Eujoon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/878,867

(22) Filed: May 20, 2020

(65) Prior Publication Data

US 2021/0072896 A1    Mar. 11, 2021

(30) Foreign Application Priority Data

Sep. 10, 2019   (KR) .......................... 10-2019-0111911

(51) Int. Cl.
 *G06F 3/00*   (2006.01)
 *G06F 3/06*   (2006.01)
 *G11C 29/38*  (2006.01)

(52) U.S. Cl.
 CPC ............ *G06F 3/065* (2013.01); *G06F 3/0604* (2013.01); *G06F 3/0679* (2013.01); *G11C 29/38* (2013.01)

(58) Field of Classification Search
 None
 See application file for complete search history.

(56) References Cited

U.S. PATENT DOCUMENTS

| | | | | |
|---|---|---|---|---|
| 2006/0239075 A1* | 10/2006 | Williams | ............... | G11C 16/10 365/185.17 |
| 2009/0034328 A1* | 2/2009 | Seol | .................... | G11C 16/349 365/185.02 |
| 2009/0055613 A1* | 2/2009 | Maki | .................... | G06F 11/1469 711/165 |
| 2013/0067139 A1* | 3/2013 | Yamamoto | .............. | G06F 40/40 711/103 |
| 2015/0248249 A1* | 9/2015 | Amidi | ................. | G06F 11/1612 711/103 |

(Continued)

FOREIGN PATENT DOCUMENTS

KR   10-2017-0052442   5/2017

OTHER PUBLICATIONS

J. Jeong and Y. H. Song, "A technique to improve garbage collection performance for NAND flash-based storage systems," in IEEE Transactions on Consumer Electronics, vol. 58, No. 2, pp. 470-478, May 2012, doi: 10.1109/TCE.2012.6227449. (Year: 2012).*

*Primary Examiner* — Daniel F. McMahon
(74) *Attorney, Agent, or Firm* — IP & T Group LLP

(57) ABSTRACT

A memory system includes: a nonvolatile memory device including a plurality of memory blocks each including a plurality of pages, the plurality of memory blocks including at least one bad block and normal block; and a controller performing a backup operation of copying data from an over-read page into a back-up page when the over-read page whose number of read requests is equal to or greater than a first reference number is detected among the plurality of pages in the normal block, and reading the data from the back-up page in response to a read request for the over-read page after the backup operation, the controller performing an operation of setting a page which is programmable/readable as the back-up page, and not using a page which is unprogrammable/unreadable, among the plurality of pages in the bad block.

20 Claims, 7 Drawing Sheets

(56) References Cited

U.S. PATENT DOCUMENTS

| | | | |
|---|---|---|---|
| 2016/0259675 A1* | 9/2016 | Ninose | G11C 29/76 |
| 2017/0262365 A1* | 9/2017 | Kanno | G06F 12/06 |
| 2018/0254092 A1* | 9/2018 | Liu | G11C 29/52 |
| 2018/0357142 A1* | 12/2018 | Wong | G06F 11/1441 |
| 2019/0304562 A1* | 10/2019 | Cai | G06F 3/064 |
| 2021/0072896 A1* | 3/2021 | Byun | G11C 29/88 |

* cited by examiner

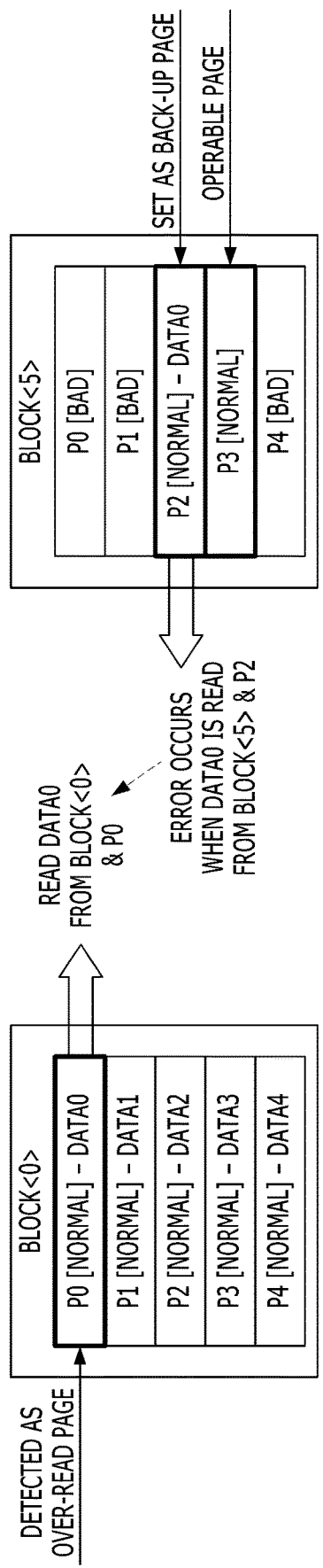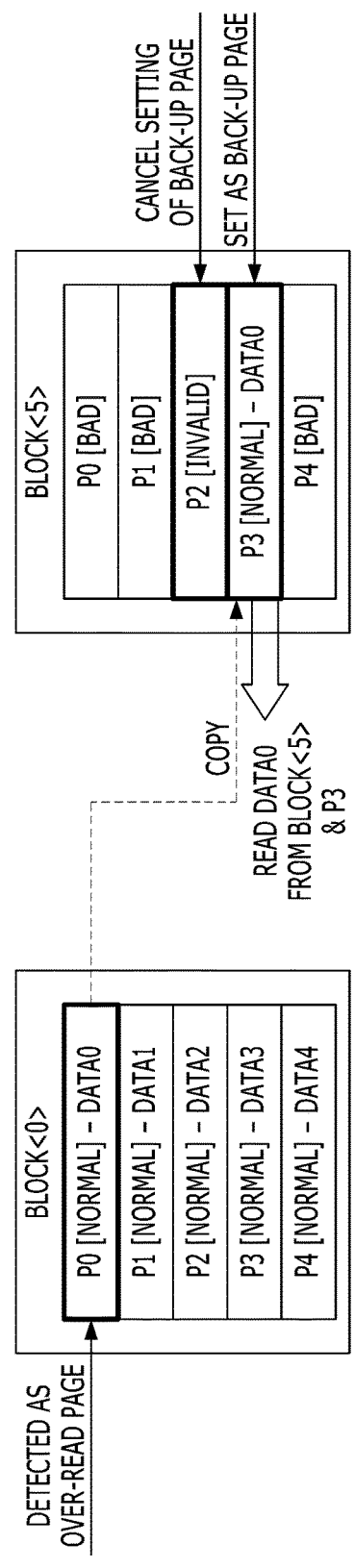

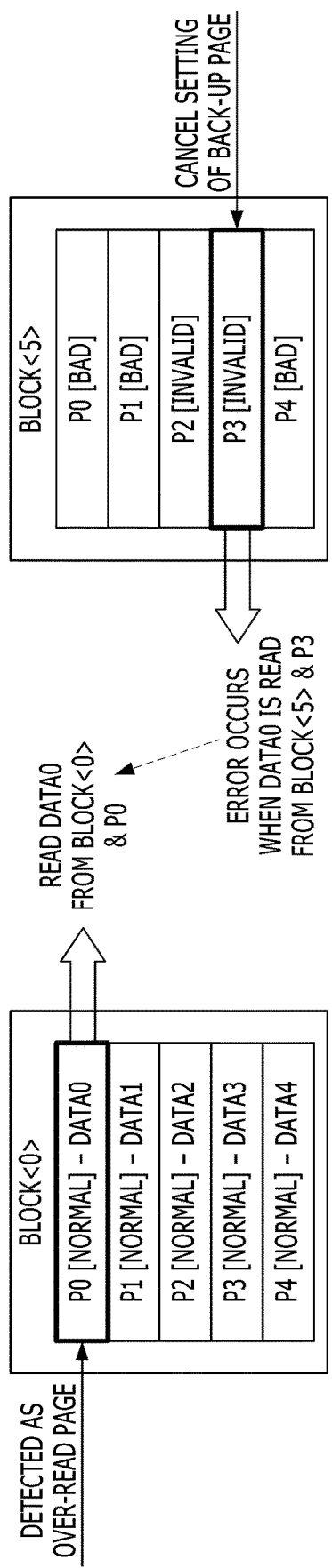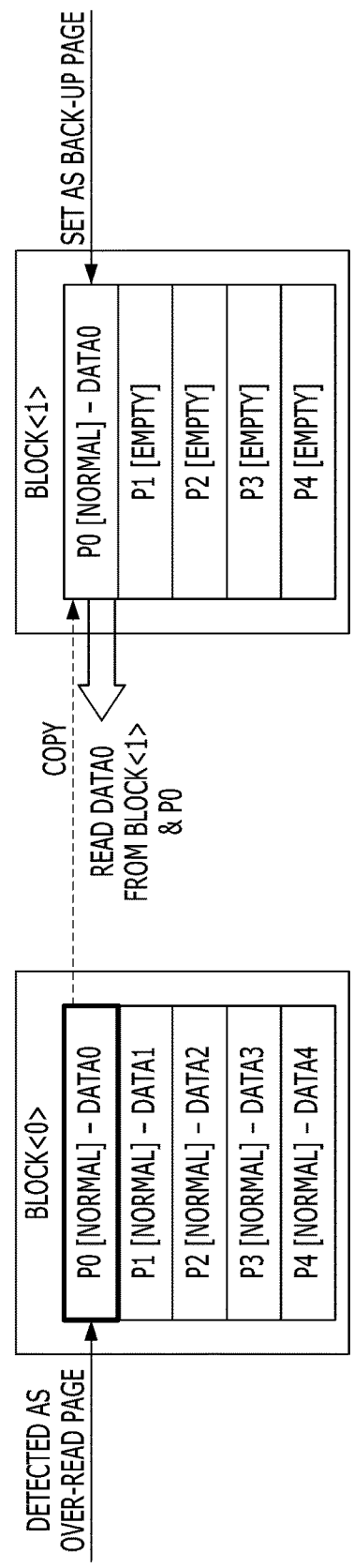

MEMORY SYSTEM FOR DISTRIBUTING AND READING DATA AND OPERATING METHOD THEREOF

CROSS-REFERENCE TO RELATED APPLICATION(S)

The present application claims priority under 35 U.S.C. § 119(a) to Korean Patent Application No. 10-2019-0111911, filed on Sep. 10, 2019, which is incorporated herein by reference in its entirety.

BACKGROUND

1. Field

Various embodiments of the present disclosure generally relate to a memory system, and more particularly, to a memory system capable of distributing and reading data for which read is requested, and an operating method thereof.

2. Description of the Related Art

Recently, a computer environment paradigm has shifted to ubiquitous computing, which enables a computer system to be accessed anytime and everywhere. As a result, the use of portable electronic devices such as mobile phones, digital cameras, notebook computers and the like has increased. Such portable electronic devices typically use or include a memory system that uses or embeds at least one memory device, i.e., a data storage device. The data storage device can be used as a main storage device or an auxiliary storage device of a portable electronic device.

In a computing device, unlike a hard disk, a data storage device implemented as a nonvolatile semiconductor memory device is advantageous in that it has excellent stability and durability because it has no mechanical driving part (e.g., a mechanical arm), and has high data access speed and low power consumption. Examples of such a data storage device include a universal serial bus (USB) memory device, a memory card having various interfaces, and a solid state drive (SSD).

SUMMARY

Various embodiments of the present disclosure are directed to a memory system, a data processing system and a method for operating the memory system and the data processing system, which may minimize complexity and performance degradation of the memory system, maximize use efficiency of a memory device, and rapidly and stably process data with the memory device.

Various embodiments of the present disclosure are directed to a memory system and an operating method thereof, which may detect some pages on which a read request is concentrated, distribute data of the detected pages to a plurality of pages, and then distribute and read data in the plurality of pages.

In accordance with an embodiment of the present invention, a memory system may include: a nonvolatile memory device including a plurality of memory blocks each including a plurality of pages, wherein the plurality of memory blocks include at least one bad block and normal block; and a controller suitable for performing a backup operation of copying data from an over-read page into a back-up page when the over-read page, a number of read requests to which is equal to or greater than a first reference number, is detected among the plurality of pages in the normal block, and reading the data from the back-up page in response to a read request for the over-read page after the backup operation. The controller may be further suitable for performing an operation of setting a page which is programmable/readable, among the plurality of pages in the bad block, as the back-up page.

When a number of errors equal to or greater than a reference value occur when reading data from the back-up page in response to the read request for the over-read page, the controller may read data from the over-read page, may invalidate the back-up page, and may perform an operation of canceling the setting of the back-up page.

After the canceling operation, the controller may set an empty page, among the plurality of pages in the normal block, as the back-up page when no page which is programmable/readable is present among the plurality of pages in the bad block.

The controller may detect at least one page which is programmable/readable, among the plurality of pages in the bad block, during a detection time period, and may generate a page list including the detected page. The controller may set the back-up page with reference to the page list.

The controller may detect the page which is programmable/readable by performing a test operation of programming/reading dummy data in each of the pages in the bad block. The controller may detect, as the page which is programmable/readable, a page whose number of errors is less than or equal to a reference number of errors as a result of performing the test operation.

The controller may enter the detection time period when a command is not inputted from a host for a reference time or more, and may exit from the detection time period in response to a command inputted from the host.

The controller may set an empty page, among the plurality of pages in the normal block, as the back-up page when no page with programmable/readable data is present among the plurality of pages in the bad block.

The controller may select normal blocks, whose number of read requests in units of blocks is equal to or greater than a second reference number, from the plurality of memory blocks, and detects the over-read page among a plurality of pages in any one of the selected normal blocks. The first reference number may be smaller than or equal to the second reference number.

The controller may select blocks whose number of read requests in units of blocks is equal to or greater than a second reference number, from the plurality of memory blocks, may detect a candidate page whose number of read requests is equal to or greater than a third reference number among a plurality of pages in any one of the selected normal blocks, and may detect the candidate page as the over-read page when the number of read requests to the candidate page is equal to or greater than the first reference number. The third reference number may be smaller than the first reference number, and the first reference number of times may be smaller than or equal to the second reference number.

In accordance with an embodiment of the present invention, an operating method of a memory system that includes a nonvolatile memory device including a plurality of memory blocks each including a plurality of pages, the operating method may include: dividing the plurality of memory blocks into at least one bad block and normal blocks; detecting, in a first detection operation, an over-read page, a number of read requests to which is equal to or greater than a first reference number, among a plurality of pages in each of the normal blocks; setting, in a first setting operation, a page which is programmable/readable, among a plurality of pages in the bad block, as a back-up page; and copying data from the over-read page into the back-up page, and then reading the data from the back-up page in response to the read request for the over-read page.

The operating method may further include: reading the data from the over-read page when a number of errors that occur in the copying operation is equal to or greater than a reference value; and invalidating the back-up page and then canceling the setting of the back-up page after the reading operation.

The operating method may further include setting, in a second setting operation, an empty page, among the plurality pages in a normal block, as the back-up page when there is no page which data is programmable/readable present among the plurality of pages in the bad block, after the invalidating operation.

The operating method may further include: detecting, in a second detection operation, at least one page which is programmable/readable, among the plurality of pages in the bad block, during a detection time period, and generating a page list including the detected page. The first setting operation may be performed with reference to the page list.

The second detection operation may include: programming/reading dummy data set in each of the pages in the bad block; and detecting, in a third detection operation, as the page which is programmable/readable, a page in which a set number of errors or less occurred as a result of performing the test operation.

The operating method may further include: entering the detection time period when a command is not inputted from a host for a reference time or more; and exiting from the detection time period in response to the command inputted from the host.

The operating method may further include setting, in a third setting operation, an empty page, among the plurality of pages in the normal block, as the back-up page when no page with programmable/readable data is present among the plurality of pages in the bad block.

The first detection operation may include: selecting normal blocks whose number of read requests in units of blocks is equal to or greater than a second reference number among the plurality of memory blocks; and detecting the over-read page among a plurality of pages included in any of the selected normal blocks. The first reference number may be smaller than or equal to the second reference number.

The first detection operation may include: selecting normal blocks whose number of read requests in units of blocks is equal to or greater than a second reference number, among the plurality of memory blocks; detecting a candidate page, to which a number of read requests is equal to or greater than a third reference number, among a plurality of pages in any one of the selected normal blocks; and detecting the candidate page as the over-read page when the number of read requests to the candidate page is equal to or greater than the first reference number. The third reference number may be smaller than the first reference number, and the first reference number may be smaller than or equal to the second reference number.

In accordance with an embodiment of the present invention, a memory system may include: a memory device including first and second blocks having first and second pages respectively; and a controller suitable for controlling the memory device to: copy current data from the first page into the second page, when the first page has been read more than a threshold number of times; and read the copied data from the second page in response to a read request for the original data. The second page may be detected to operate normally when the second block is detected as a bad block at a time that the current data is copied.

The controller may be suitable for controlling the memory device to read the current data from the first page, when the read of the copied data fails.

These and other features and advantages of the present disclosure are not limited to the embodiments described above, and will be apparently understood by those skilled in the art to which the present disclosure pertains from the following detailed description in conjunction with the accompanying drawings.

BRIEF DESCRIPTION OF THE DRAWINGS

FIGS. 4A to 4F illustrate an operating method of a memory system in accordance with an embodiment of the present invention.

DETAILED DESCRIPTION

Figure 1:
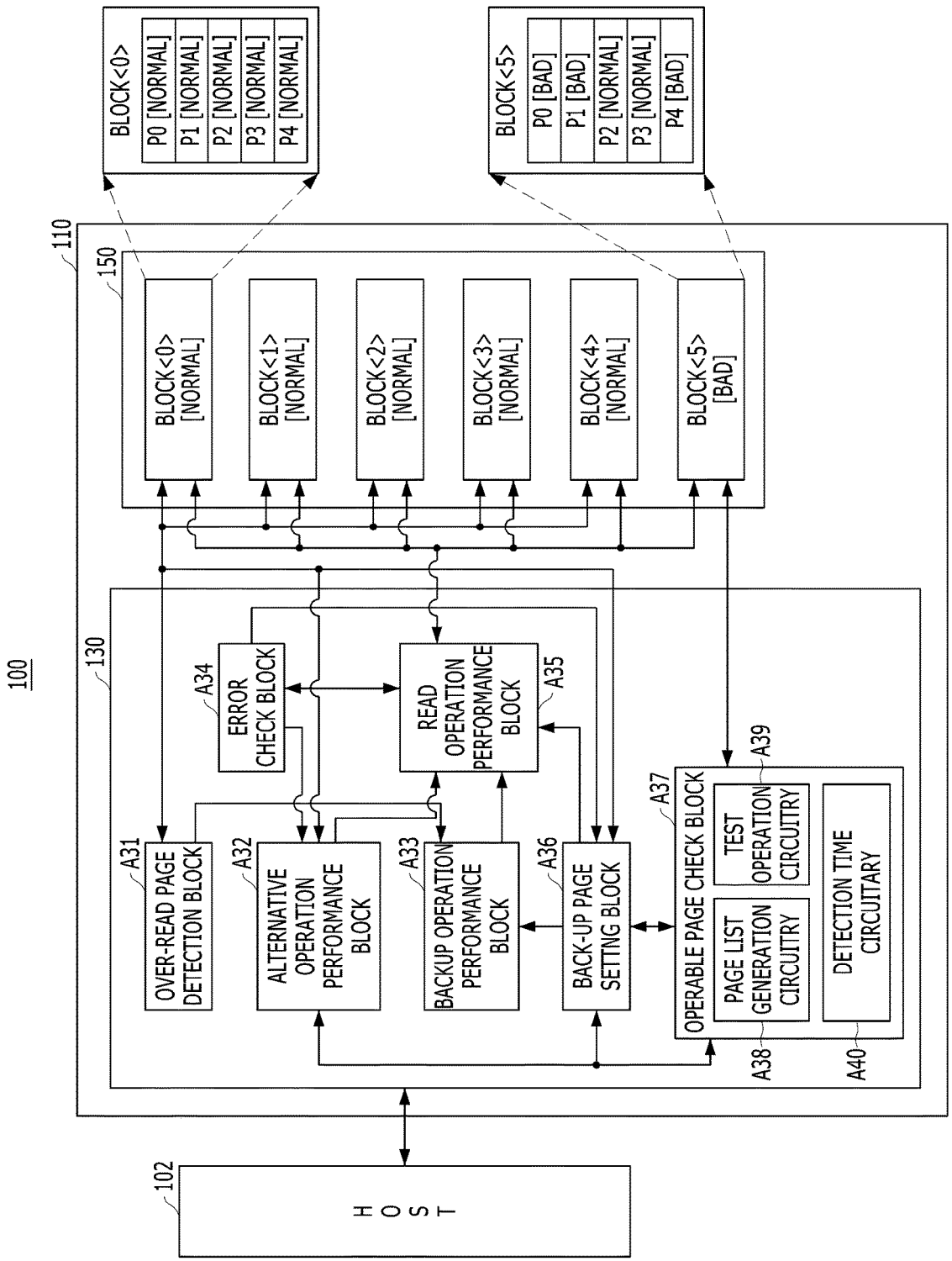
FIG. 1 is block diagram illustrating a data processing system including a memory system in accordance with an embodiment of the present invention.

Various examples of the disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention belongs in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

FIG. 1 is block diagram illustrating a data processing system including a memory system in accordance with an embodiment of the present invention.

For example, the memory system 110 may be embodied in or on a computing device or a mobile device, and transmit and receive data in interconnection with a host 102.

Referring to FIG. 1, the data processing system 100 includes the host 102 and the memory system 110. The memory system 110 includes a controller 130 and a memory device 150. The controller 130 may include an over-read page detection block A31, an alternative operation performance block A32, a backup operation performance block A33, an error check block A34, a read operation performance block A35, a back-up page setting block A36 and an operable page check block A37. The operable page check block A37 may include a page list generation circuitry A38, a test operation circuitry A39 and a detection time circuitry A40. The memory device 150 may include a plurality of memory blocks BLOCK<0:5>. Each of the memory blocks BLOCK<0:5> may include a plurality of pages P<0:4>.

As used in this disclosure, the term 'circuitry' may refer to one or more of (a) hardware-only circuit implementations, such as implementations in only analog and/or digital circuitry (b) combinations of circuits and software (and/or firmware), such as: (i) a combination of processor(s) or (ii) portions of processor(s)/software including digital signal processor(s), software, and memory that work together to cause an apparatus, such as a mobile phone or server, to perform various functions and (c) to circuits, such as a microprocessor or a portion of a microprocessor, that uses software or firmware, even if the software or firmware is not physically present. As a further example, the term "circuitry" may refer to one or more processor or portion of a processor and accompanying software and/or firmware. The term "circuitry" may refer to an integrated circuit for a storage device.

The controller 130 may perform a read operation, a program operation, an erase operation and a background operation. The controller 130 may perform the read operation to output data requested by the host 102 or data required in the memory system 110 from the memory device 150. The controller 130 may perform the program operation to store the data transferred from the host 102 or the data generated in the memory system 110 in the memory device 150. The controller 130 may perform the erase operation to erase the data stored in the memory device 150. The controller 130 may perform the background operation to manage the data stored in the memory device 150.

The design of the internal configuration of the memory device 150 may be different depending on characteristics of the memory device 150, a purpose for which the memory system 110 is used, or specification(s) of the memory system 110 and/or the host 102.

For example, the memory device 150 as a non-volatile memory device may be implemented as a NAND flash memory, a vertical NAND flash memory, a NOR flash memory, a resistive random access memory (RRAM), a phase-change memory (PRAM), a magneto resistive random access memory (MRAM), a ferroelectric random access memory (FRAM), a spin transfer torque random access memory (SU-RAM) or the like.

The memory device 150 may be implemented as a three-dimensional array structure. Embodiments of the present disclosure may be applied to a charge trap flash (CTF) in which a charge storage layer is formed of a dielectric layer as well as a flash memory device in which a charge storage layer is formed of a conductive floating gate.

The memory device 150 is configured to receive a command and an address from the controller 130 and to access a region of the memory cell array, which is selected by the address. In other words, the memory device 150 may perform an operation corresponding to the command on the region selected by the address.

For example, the memory device 150 may perform the program operation, the read operation and the erase operation. In this regard, the memory device 150 may program data into the region selected by the address during the program operation. During the read operation, the memory device 150 may read data from the region selected by the address. During the erase operation, the memory device 150 may erase data stored in the region selected by the address.

The controller 130 may control the operations of the memory device 150 according to the request of the host 102 or in the absence of a request of the host 102.

For example, the controller 130 may control the write, i.e., program, read, erase and background operations of the memory device 150. The background operation may be, for example, a garbage collection (GC) operation, a wear leveling (WL) operation, a bad block management (BBM) operation, a read reclaim (RRC) operation or the like.

The controller 130 may control an operation of the memory system 110 by executing firmware. In other words, in order to control the overall operations of the memory device 150 and perform logical operations, the controller 130 may load and execute or drive the firmware into a memory 144 during boot-up time. For example, the firmware may be stored in the memory device 150, and then loaded into the memory 144.

The firmware, which is a program executed in the memory system 110, may include, for example, a flash translation layer (FTL), a host interface layer (HIL) and a flash interface layer (FIL). The FTL may perform a translation function between a logical address of the memory system 110 requested by the host 102 and a physical address of the memory device 150. The HIL may serve to interpret a command requested by the host 102 from the memory system 110, which is a storage device, and transfer the command to the FTL. The FIL may transfer a command, which is instructed by the FTL, to the memory device 150.

Among the memory blocks BLOCK<0:5> in the memory device 150 at least one is a bad memory block BLOCK<5> and the others are normal memory blocks BLOCK<0:4>.

The number of bad pages among the plurality of pages P<0:4> in a bad memory block exceeds a set number, whereas the number of bad pages in a normal block is less than or equal to the set number. Therefore, a bad memory block need not have all bad pages but has more than the set number of bad pages. For example, in the case of a fifth memory block BLOCK<5> among the memory blocks BLOCK<0:5> in the memory device 150 as illustrated in the drawing, zeroth, first and fourth pages P<0, 1, 4> among the plurality of pages P<0:4> are bad pages, but second and third pages P <2, 3> are normal pages. Thus, if the set number of bad pages is 3 or less, BLOCK<5> is a bad memory block, whereas if the set number of bad pages is 4 or more, BLOCK<5> is a normal memory block.

In addition, a normal page and a bad page may be distinguished based on whether data is normally programmable and/or readable into that page. This distinction may consider only whether data is normally programmable into the target page, or it may consider whether the data is normally programmable into the target page, and then the programmed data is normally readable. Whether data is normally programmed/read into the target page may be determined based on whether the number of errors that occur when the data is programmed/read into the target page is less than or equal to a reference value.

The "set number" for distinguishing a bad memory block from a normal memory block may vary according to kind or type of the memory device 150, and may be "1" in the present embodiment illustrated in the drawing. In other words, in the present embodiment, when all pages included in a memory block are normal pages, the memory block is defined as the normal memory block. In addition, the "reference value" for distinguishing a normal page from a bad page may vary according to kind or type of the memory device 150, and may represent the number of errors that can be recovered through operation of an error correction circuit (ECC, not illustrated) which may be included in the controller 130 or the memory device 150.

When an "over-read page" for which read is requested and whose number of read requests is equal to or greater than a first reference number is detected among the plurality of pages in the normal memory blocks BLOCK<0:4> in the memory device 150 and a "back-up page" is set, the controller 130 according to the present embodiment may perform a backup operation of copying data from the "over-read page" into the "back-up page".

The controller 130 may read the data from the "back-up page" in response to the read request for the "over-read page" after performing the backup operation. In other words, the controller 130 may perform the read operation on the "back-up page" instead of on the "over-read page" when the read request for the "over-read page" occurs after performing the backup operation.

The controller 130 may perform a check operation of checking whether operable pages which are programmable/readable are present among the plurality of pages in the bad memory block BLOCK<5>. When the result of the check operation indicates that the operable pages P<2, 3> are present, the controller 130 may set an operable page P<2> or P<3> as the "back-up page". When the result of the check operation indicates that the operable pages P<2, 3> are not present, the controller 130 may set, as the "back-up page", an empty page, among the plurality of pages included in the normal memory blocks BLOCK<0:4>.

When errors, the number of which is equal to or greater than the reference value, occur when the controller 130 reads the data from the "back-up page" in response to the read request for the "over-read page", the controller 130 may perform an alternative operation of reading the data from the "over-read page", and invalidating the operable page P<2> or P<3> of the bad memory block BLOCK<5>, which corresponds to the "back-up page", and then canceling the setting of the "back-up page". In other words, when the controller 130 cannot normally read the data from the operable page P<2> or P<3> of the bad memory block BLOCK<5>, which is set as the "back-up page", in response to the read request for the "over-read page", the controller 130 may read first the data from the "over-read page", thereby completely processing the read request for the "over-read page". Subsequently, the controller 130 may invalidate the operable page P<2> or P<3> of the bad memory block BLOCK<5>, which corresponds to the "back-up page" that cannot be normally read, and cancel the setting of the "back-up page" so as to perform the alternative operation. Accordingly, the page, which is set as the "back-up page", may not be present when the alternative operation is completely performed.

After the alternative operation, the controller 130 may perform a check operation of checking whether the operable page P<2> or P<3> which is programmable/readable is present among the plurality of pages included in the bad memory block BLOCK<5> included in the memory device 150. When the result of the check operation indicates that the operable page P<2> or P<3> is present, the controller 130 may set the operable page P<2> or P<3> as the "back-up page". When the result of the check operation indicates that the operable page P<2> or P<3> is not present, the controller 130 may set an empty page, among the plurality of pages included in the normal memory blocks BLOCK<0:4>, as the "back-up page".

Specifically, the over-read page detection block A31 included in the controller 130 may detect the "over-read page" in any of the following two ways.

The first way is to select memory blocks whose number of read requests in units of blocks is equal to or greater than a second reference number, among the normal memory blocks BLOCK<0:4> in the memory device 150, and to detect, when a page whose number of read requests is equal to or greater than a first reference number is present among a plurality of pages in any of the selected memory blocks, the page as the "over-read page". The first reference number may be smaller than or equal to the second reference number.

In the first way, the controller 130 may select a memory block, on which the read requests are concentrated, that is, which is read equal to or greater than the second reference number, among the normal memory blocks BLOCK<0:4>. When no memory block on which the read requests are concentrated is present, the controller 130 may not perform an operation of detecting the "over-read page" any longer. However, when one or more memory blocks on which the read requests are concentrated are present, the controller 130 may perform the operation of detecting the "over-read page" of each of the memory blocks. For example, when there are two memory blocks on which the read requests are concentrated, the controller 130 may perform the operation of detecting a "over-read page" of a first memory block and the operation of detecting a "over-read page" of a second memory block.

As above, when one or more memory blocks on which the read requests are concentrated are selected, the controller 130 may detect a page on which the read requests are concentrated, that is, a page which has been read equal to or greater than the first reference number, among the plurality of pages P<0:4> in any of the memory blocks on which the read requests are concentrated. When there is no page which has been read equal to or greater than the first reference number, the controller 130 may not perform the operation of detecting the "over-read page" any longer. In other words, no page is detected as the "over-read page", that is, a page which has been read equal to or greater than the first reference number. However, when there are one or more pages which are read equal to or greater than the first reference number, the controller 130 may detect each of the pages as the "over-read page". For example, when there are three memory blocks on which the read requests are concentrated, one page which is read equal to or greater than the first reference number may be present in a first memory block, two pages which are read equal to or greater than the first reference number may be present in a second memory block, and no page which is read equal to or greater than the first reference number may be present in a third memory block. In this case, the one page may be detected as the "over-read page" in the first memory block, the two pages may be detected as the "over-read pages" in the second memory block, and no page is detected as the "over-read page" in the third memory block.

The second way is to select a memory block whose number of read requests in units of blocks is equal to or greater than a second reference number among the normal memory blocks BLOCK<0:4>, to set, when a page whose number of read requests is equal to or greater than a third reference number is present among a plurality of pages in the selected memory block, the page as a candidate page, and to detect the candidate page as the "over-read page" when the number of read requests for the candidate page is equal to or greater than a first reference number. The third reference number may be smaller than the first reference number. Also, the first reference number may be smaller than or equal to the second reference number.

In the second way, the controller 130 may select a memory block on which the read requests are concentrated, that is, which is read equal to or greater than the second reference number, among the normal memory blocks BLOCK<0:4>. When no memory block on which the read requests are concentrated is present, the controller 130 may not perform an operation of detecting the "over-read page" any longer. However, when one or more memory blocks on which the read requests are concentrated are present, the controller 130 may perform the operation of detecting the "over-read page" of each of the memory blocks. For example, when there are two memory blocks on which the read requests are concentrated, the controller 130 may perform the operation of detecting a "over-read page" of a first memory block and the operation of detecting a "over-read page" of a second memory block.

As above, when one or more memory blocks on which the read requests are concentrated are selected, the controller 130 may set, to the candidate page, a page on which the read requests are concentrated, that is, a page which is read equal to or greater than the third reference number, among a plurality of pages in the memory blocks on which the read requests are concentrated. When no page which has been read equal to or greater than the third reference number is present, the candidate page may not be set. However, when one or more pages which are read equal to or greater than the third reference number are present, the controller 130 may set each of the pages to the candidate page. When one or more candidate pages are set, and then the number of read requests for each of the candidate pages is equal to or greater than the first reference number, the controller 130 may detect each of the candidate pages as the "over-read page".

For example, when there are three memory blocks on which the read requests are concentrated, one page which has been read equal to or greater than the third reference number may be present in a first memory block, two pages which have been read equal to or greater than the third reference number may be present in a second memory block thereof, and no page which has been read equal to or greater than the third reference number may be present in a third memory block. In this case, the one page may be set to the candidate page in the first memory block, the two pages may be set to the candidate page in the second memory block, and the candidate page may not be set in the third memory block. When there is one candidate page for which read has been requested equal to or greater than the first reference number a state where a total of three candidate pages are set, the controller 130 may detect the one candidate page as the "over-read page". When there are two candidate pages which have been requested to be read equal to or greater than the first reference number, the controller 130 may detect the two candidate pages as the "over-read pages". When there are three candidate pages which have been requested to be read equal to or greater than the first reference number, the controller 130 may detect the three candidate pages as the "over-read pages". When there is no candidate page which has been requested to be read equal to or greater than the first reference number, none of the three candidate pages may be set as the "over-read pages".

In summary, the over-read page detection block A31 may perform the operation of detecting, as the "over-read pages", some pages on which the read requests are concentrated, among the pages P<0:4> in any of the normal memory blocks BLOCK<0:4> in the memory device 150. For example, the number of read requests in units of blocks for each of a zeroth memory block BLOCK<0> and a first memory block BLOCK<1> among the normal memory blocks BLOCK<0:4> may exceed the second reference number. In this case, when the read request is concentrated only on the zeroth page P<0> among the pages P<0:4> in the zeroth memory block BLOCK<0>, and the number of read requests for the zeroth page P<0> exceeds the first reference number, the controller 130 may detect the zeroth page P<0> as the "over-read page" in the zeroth memory block BLOCK<0>. However, when the read requests are distributed to each of the pages P<0:4> in the first memory block BLOCK<1>, and thus there is no page for which the number of read requests exceeds the first reference number, no page may be detected as the "over-read page" in the first memory block BLOCK<1>.

When one or more pages which are programmable/readable are detected among a plurality of pages, included in a bad memory block in the memory device 150, during a detection time period, the operable page check block A37 in the controller 130 may generate a page list including information of the detected pages.

Specifically, the test operation circuitry A39 in the operable page check block A37 may perform a test operation of programming/reading dummy data, which is set for each of the pages in the bad memory block, during the detection time period. The set dummy data may have a predefined pattern but have no meaning. For example, the test operation circuitry A39 may perform the test operation of programming/reading the dummy data, which is set for each of the pages P <0:4> in the bad memory block BLOCK<5>, during the detection time period.

The page list generation circuitry A38 included in the operable page check block A37 may detect, as the pages which are programmable/readable, pages in which errors whose number is equal to or less than a reference value occur as a result of the test operation performed by the test operation circuitry A39, and generate the page list by grouping information of the detected pages in a list form. For example, the operable page check block A37 may detect that the second and third pages P<2, 3> are programmable/readable, among the pages P<0:4>, in the bad memory block BLOCK<5>, through the test operation performed by the test operation circuitry A39. Accordingly, the operable page check block A37 may generate the page list by grouping information of the second and third pages P<2, 3>, in the bad memory block BLOCK<5>, in the list form.

The detection time circuitry A40 included in the operable page check block A37 may enter a detection time period when a command is not inputted from the host 102 for greater than a reference time. In addition, the detection time circuitry A40 may exit from the detection time period in response to a command inputted from the host 102. According to embodiments, the command inputted from the host 102 may be any of various operation commands, such as read/write/erase/sleep mode entry commands/background operation command. In other words, the memory system 110 may enter/exit from the set mode in a period in which no command is transferred from the host 102, and the host 102 may not know the entry/exit of the memory system 110. For reference, the detection time period may be set such that it has no influence on the operation of the memory system 110 with the host 102 while power is supplied to the memory system 110. In another embodiment, the detection time period may be predefined in coordination with the host 102.

The back-up page setting block A36 in the controller 130 may perform a check operation of checking whether the operable page which is programmable/readable is present among the plurality of pages in the bad memory block, with reference to the page list generated by the operable page check block A37. In addition, when the result of performing the check operation indicates that the operable page is present, the back-up page setting block A36 may set the operable page as the "back-up page". On the contrary, when the result of performing the check operation indicates that the operable page is not present, the back-up page setting block A36 may set, as the "back-up page", an empty page among the plurality of pages included in the normal memory blocks BLOCK<0:4>.

When the "over-read page" is detected by the over-read page detection block A31, and the "back-up page" is set by the back-up page setting block A36, the backup operation performance block A33 in the controller 130 may perform a backup operation of copying the data from the "over-read page" into the "back-up page".

After the backup operation performance block A33 performs the backup operation of copying the data from the "over-read page" into the "back-up page", the read operation performance block A35 may perform a read operation on the "back-up page" instead of the "over-read page" when the read request for the "over-read page" occurs.

The error check block A34 may check errors which occur in the data read by the read operation performance block A35. Particularly, the error check block A34 may check whether errors whose number is equal to or greater than a reference value have occurred in the data read from the "back-up page" by the read operation performance block A35, and notify the read operation performance block A35, the alternative operation performance block A32 and the back-up page setting block A36 of a check result.

When notified by the error check block A34 that the errors whose number is equal to or greater than the reference value has occurred in the data read from the "back-up page" instead of from the "over-read page" upon the read request, the read operation performance block A35 may read the data from the "over-read page".

When notified by the error check block A34 that the errors whose number is equal to or greater than the predetermined reference value has occurred in the data read from the "back-up page" instead of from the "over-read page" upon the read request, the alternative operation performance block A32 may invalidate the operable page P<2> or P<3> of the bad memory block BLOCK<5> corresponding to the "back-up page", and perform the alternative operation of requesting the back-up page setting block A36 and the operable page check block A37 to cancel the setting of the "back-up page".

The page list generation circuitry A38 in the operable page check block A37 may erase, from the page list, information on the operable page P<2> or P<3> of the bad memory block BLOCK<5> corresponding to the "back-up page" in response to the request of the alternative operation performance block A32 to cancel the setting of the "back-up page".

The back-up page setting block A36 may cancel the setting of the "back-up page" in response to the request of the alternative operation performance block A32 to cancel the setting of the "back-up page". In response to the operation of cancelling, by the back-up page setting block A36, the setting of the "back-up page", the read operation performance block A35 may perform the read operation on the "over-read page" in response to the read request for the "over-read page".

Since the setting of the "back-up page" has been canceled, the back-up page setting block A36 may check the check whether an operable page whose data is programmable/readable is present among the plurality of pages in the bad memory block in the memory device 150, with reference to the page list of the operable page check block A37 again. In addition, when the result of performing the check operation indicates that the operable page is present, the back-up page setting block A36 may set the operable page as the "back-up page". On the contrary, when the result of performing the check operation indicates that the operable page is not present, the back-up page setting block A36 may set, as the "back-up page", an empty page among the plurality of pages included in the normal memory blocks BLOCK<0:4>. Through this process, the backup operation performance block A33 may perform the backup operation of copying the data from the "over-read page" into the "back-up page" in response to the operation of setting, by the back-up page setting block A36, the "back-up page" again. In response to the backup operation of copying, by the backup operation performance block A33, copying the data from the "over-read page" into the "back-up page" again, the read operation performance block A35 may perform the read operation on the "back-up page" instead of the "over-read page" when the read request for the "over-read page" occurs.

Figure 2:
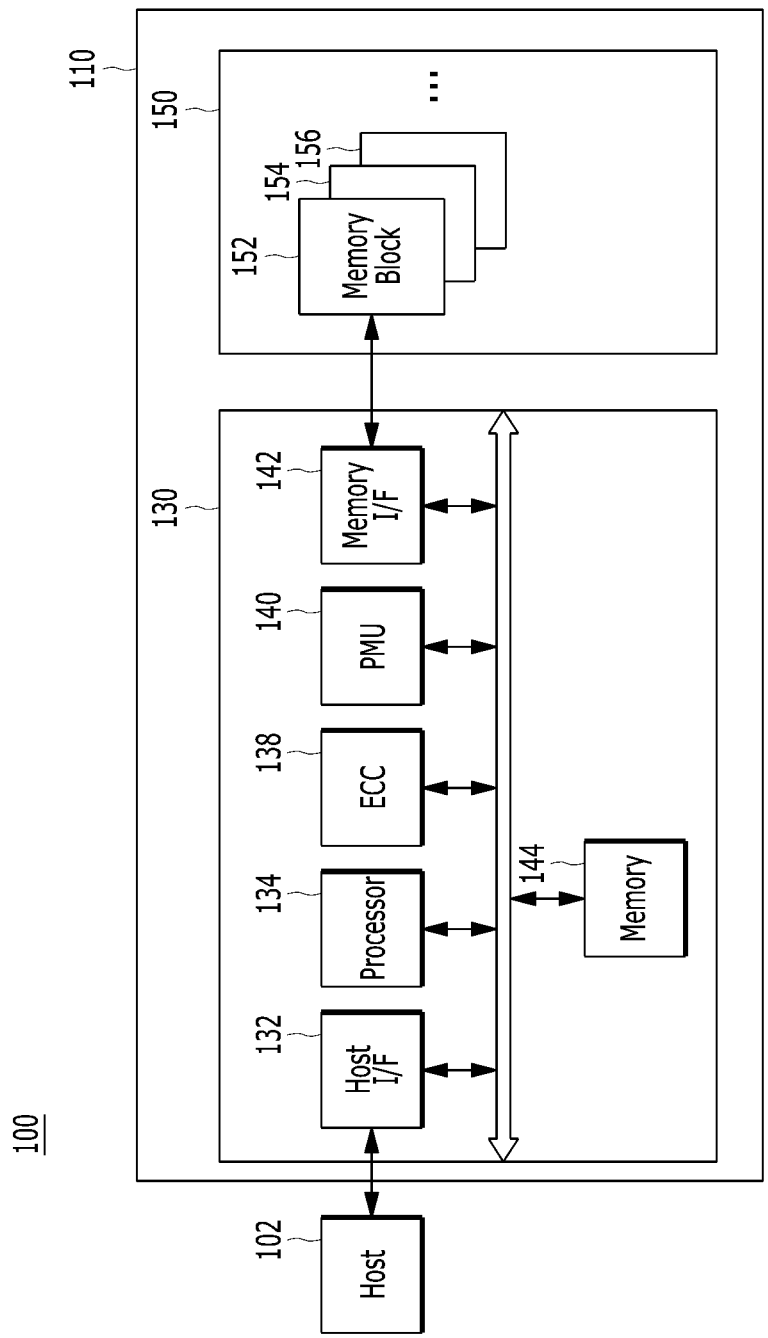
FIG. 2 is a block diagram illustrating a data processing system including a memory system in accordance with an embodiment of the present invention.

FIG. 2 is a block diagram illustrating a data processing system including a memory system in accordance with an embodiment of the present invention.

Referring to FIG. 2, the data processing system 100 may include a host 102 engaged or operably coupled with a memory system 110.

The host 102 may include any of a variety of portable electronic devices, such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS may provide interoperability between the host 102 engaged with the memory system 110 and the user of the memory system 110. The OS may support functions and operations corresponding to user's requests. By way of example but not limitation, the OS may include a general operating system and a mobile operating system according to mobility of the host 102. The general operating system may be split into a personal operating system and an enterprise operating system according to system requirements or user's environment. The personal operating system, including Windows and Chrome, may be subject to support services for general purposes. The enterprise operating systems may be specialized for securing and supporting high performance, including Windows servers, Linux and Unix. Further, the mobile operating system may include an Android and iOS. The mobile operating system may be subject to support services or functions for mobility (e.g., a power saving function). The host 102 may include a plurality of operating systems. The host 102 may execute multiple operating systems in cooperation with the memory system 110, corresponding to a user's request. The host 102 may transmit a plurality of commands corresponding to the user's requests into the memory system 110, thereby performing operations corresponding to commands within the memory system 110.

The memory system 110 may perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card and a memory stick.

The storage devices for the memory system 110 may be implemented with a volatile memory device, for example, a dynamic random access memory (DRAM) or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) or a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as described above.

By way of example but not limitation, the controller 130 and the memory device 150 may be integrated into a single semiconductor device. The controller 130 and memory device 150 may be integrated to form an SSD with improved operation speed. When the memory system 110 is used as an SSD, the operating speed of a host 102 connected to the memory system 110 can be improved more than that of a host 102 connected with a hard disk. In another embodiment, the controller 130 and the memory device 150 may be integrated into one semiconductor device to form a memory card, such as a PC card (PCMCIA), a compact flash card (CF), a smart media card (e.g., SM, SMC), a memory stick, a multimedia card (e.g., MMC, RS-MMC, MMCmicro), a secure digital (SD) card (e.g., SD, miniSD, microSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, any of various electronic devices configuring a computer network, any of various electronic devices configuring a telematics network, a radio frequency identification (RFID) device, or any of various components configuring a computing system.

The memory device 150 may be a nonvolatile memory device and may retain data stored therein even while electrical power is not supplied. The memory device 150 may store data provided from the host 102 through a write operation, while providing data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes memory blocks, among the plurality of memory blocks 152, 154, 156. In addition, the memory device 150 may be a non-volatile memory device, for example a flash memory, and the flash memory may have a three-dimensional stack structure.

The controller 130 may control overall operations of the memory device 150, such as read, write, program and erase operations. For example, the controller 130 may control the memory device 150 in response to a request from the host 102. The controller 130 may provide data, read from the memory device 150, to the host 102. The controller 130 may store data provided by the host 102 into the memory device 150.

The controller 130 may include a host interface (I/F) 132, a processor 134, error correction code (ECC) circuitry 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). According to embodiments, the host interface 132 may include the detection time circuitry A40 included in the operable page check block A37 described with reference to FIG. 1.

The ECC circuitry 138 may correct error bits of the data to be processed in (e.g., outputted from) the memory device 150. To that end, the ECC circuitry 138 may include an ECC encoder and an ECC decoder. Here, the ECC encoder may perform error correction encoding of data to be programmed in the memory device 150 to generate encoded data into which a parity bit is added and store the encoded data in memory device 150. The ECC decoder may detect and correct errors contained in data read from the memory device 150 when the controller 130 reads the data stored in the memory device 150. In other words, after performing error correction decoding on the data read from the memory device 150, the ECC circuitry 138 may determine whether the error correction decoding has succeeded and output an instruction signal (e.g., a correction success signal or a correction fail signal). The ECC circuitry 138 may use the parity bit which is generated during the ECC encoding process, for correcting the error bit of the read data. When the number of error bits is greater than or equal to a threshold number of correctable error bits, the ECC circuitry 138 may not correct error bits but instead may output an error correction fail signal indicating that the error bits are not correctable.

The ECC circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC circuitry 138 may include any and all circuits, modules, systems or devices for performing the error correction operation based on at least one of the above described codes. According to embodiments, the ECC circuitry 138 may include the error check block A34 described with reference to FIG. 1.

The PMU 140 may manage electrical power in the controller 130. For example, the PMU 140 may detect power-on and power-off. In addition, the PMU 140 may include a power detector.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 may provide an interface for handling commands and data between the controller 130 and the memory device 150, for example, operations of NAND flash interface, in particular, operations between the controller 130 and the memory device 150. In accordance with an embodiment, the memory interface 142 may be implemented through firmware called a flash interface layer (FIL) as a component for exchanging data with the memory device 150.

The memory 144 may support operations performed by the memory system 110 and the controller 130. The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data used by the controller 130 and the memory device 150 to perform operations such as read operations or program/write operations.

The memory 144 may be a volatile memory. The memory 144 may be implemented with a static random access memory (SRAM), a dynamic random access memory (DRAM) or both. Although FIG. 2 shows memory 144 disposed within the controller 130, embodiments are not limited to that arrangement. That is, the memory 144 may be disposed within or external to the controller 130. For instance, the memory 144 may be an external volatile memory having a memory interface transferring data and/or signals between the memory 144 and the controller 130.

The memory 144 may store data for performing operations such as data writing and data reading requested by the host 102 and/or data transfer between the memory device 150 and the controller 130 for background operations such as garbage collection and wear levelling. In accordance with an embodiment, for supporting operations in the memory system 110, the memory 144 may include a program memory, a data memory, a write buffer/cache, a read buffer/cache, a data buffer/cache and a map buffer/cache.

The processor 134 may be a microprocessor or a central processing unit (CPU). The memory system 110 may include one or more processors 134. The processor 134 may control overall operations of the memory system 110. By way of example but not limitation, the processor 134 may control a program operation or a read operation of the memory device 150, in response to a write request or a read request entered from the host 102. In accordance with an embodiment, the processor 134 may use or execute firmware to control the overall operations of the memory system 110. Herein, the firmware may be a flash translation layer (FTL). The FTL may serve as an interface between the host 102 and the memory device 150. The host 102 may transmit requests for write and read operations to the memory device 150 through the FTL.

According to embodiments, the processor 134, the memory interface 142 and the memory 144 may be used to perform the operations of the over-read page detection block A31, the alternative operation performance block A32, the backup operation performance block A33, the read operation performance block A35 and the page list generation circuitry A38 and test operation circuitry A39 included in the operable page check block A37, which are described above with reference to FIG. 1.

The FTL may manage operations of address mapping, garbage collection, wear-leveling and so forth. Particularly, the FTL may load, generate, update, or store map data. Therefore, the controller 130 may map a logical address, which is entered from the host 102, with a physical address of the memory device 150 through the map data. The memory device 150 may function as a general storage device to perform a read or write operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programed page) due to a characteristic of a flash memory device. Further, the controller 130 may store map data of the new data into the FTL.

For example, when performing an operation requested from the host 102 in the memory device 150, the controller 130 uses the processor 134. The processor 134 engaged with the memory device 150 may handle instructions or commands corresponding to an inputted command from the host 102. The controller 130 may perform a foreground operation as a command operation, corresponding to a command from the host 102, such as a program operation corresponding to a write command, a read operation corresponding to a read command, an erase/discard operation corresponding to an erase/discard command and a parameter set operation corresponding to a set parameter command or a set feature command with a set command.

The controller 130 may perform a background operation on the memory device 150 through the processor 134. By way of example but not limitation, the background operation for the memory device 150 includes copying data in a memory block, among the memory blocks 152, 154, 156, and storing such data in another memory block (e.g., a garbage collection (GC) operation). The background operation may include an operation to move data stored in at least one of the memory blocks 152, 154, 156 in the memory device 150, into at least another of the memory blocks 152, 154, 156 (e.g., a wear leveling (WL) operation). During a background operation, the controller 130 may use the processor 134 for storing the map data stored in the controller 130 to at least one of the memory blocks 152, 154, 156, e.g., a map flush operation. A bad block management operation of checking for bad blocks among the plurality of memory blocks 152, 154, 156 is another example of a background operation performed by the processor 134.

In the memory system 110, the controller 130 performs a plurality of command operations corresponding to a plurality of commands received from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 may determine which channel(s) or way(s) for connecting the controller 130 to which memory die(s) in the memory 150 is/are proper or appropriate for performing each operation. The controller 130 may transmit data or instructions via the channel(s) or way(s) for performing each operation. The plurality of memory dies may transmit an operation result via the same channel(s) or way(s), respectively, after each operation is complete. Then, the controller 130 may transmit a response or an acknowledge signal to the host 102. In an embodiment, the controller 130 may check a status of each channel or each way. In response to a command received from the host 102, the controller 130 may select at least one channel or way based on the status of each channel or each way so that instructions and/or operation results with data may be delivered via selected channel(s) or way(s).

The controller 130 may check the states of a plurality of channels (or ways) coupled to a plurality of memory dies that are included in the memory device 150.

By way of example but not limitation, the controller 130 may recognize statuses regarding channels (or ways) associated with memory dies in the memory device 150. The controller 130 may determine each channel or each way as being in a busy state, a ready state, an active state, an idle state, a normal state, or an abnormal state. The controller's determination of which channel or way an instruction (and/or a data) is delivered through can be based on a physical block address, e.g., to which die(s) the instruction (and/or the data) is delivered. The controller 130 may refer to descriptors delivered from the memory device 150. The descriptors may include a block or page of parameters that describe characteristics of the memory device 150, and may have a set format or structure. The descriptors may include device descriptors, configuration descriptors, unit descriptors, and the like. The controller 130 can refer to, or use, the descriptors to determine with which channel(s) or way(s) an instruction or a data is exchanged.

A management unit (not shown) may be included in the processor 134. The management unit may perform bad block management of the memory device 150. The management unit may find bad memory blocks, which are in unsatisfactory condition for further use, as well as perform bad block management on the bad memory blocks. When the memory device 150 is a flash memory such as a NAND flash memory, a program failure may occur during the write operation, for example, during the program operation, due to characteristics of a NAND logic function. During the bad block management, the data of the program-failed memory block or the bad memory block may be programmed into a new memory block. For example, a read failure may occur while reading data, and a block in which the read failure occurs is managed as the bad block. The bad blocks may substantially reduce the utilization efficiency of the memory device 150 having a 3D stack structure and the reliability of the memory system 110. Thus, reliable bad block management may enhance or improve performance of the memory system 110.

Figure 3:
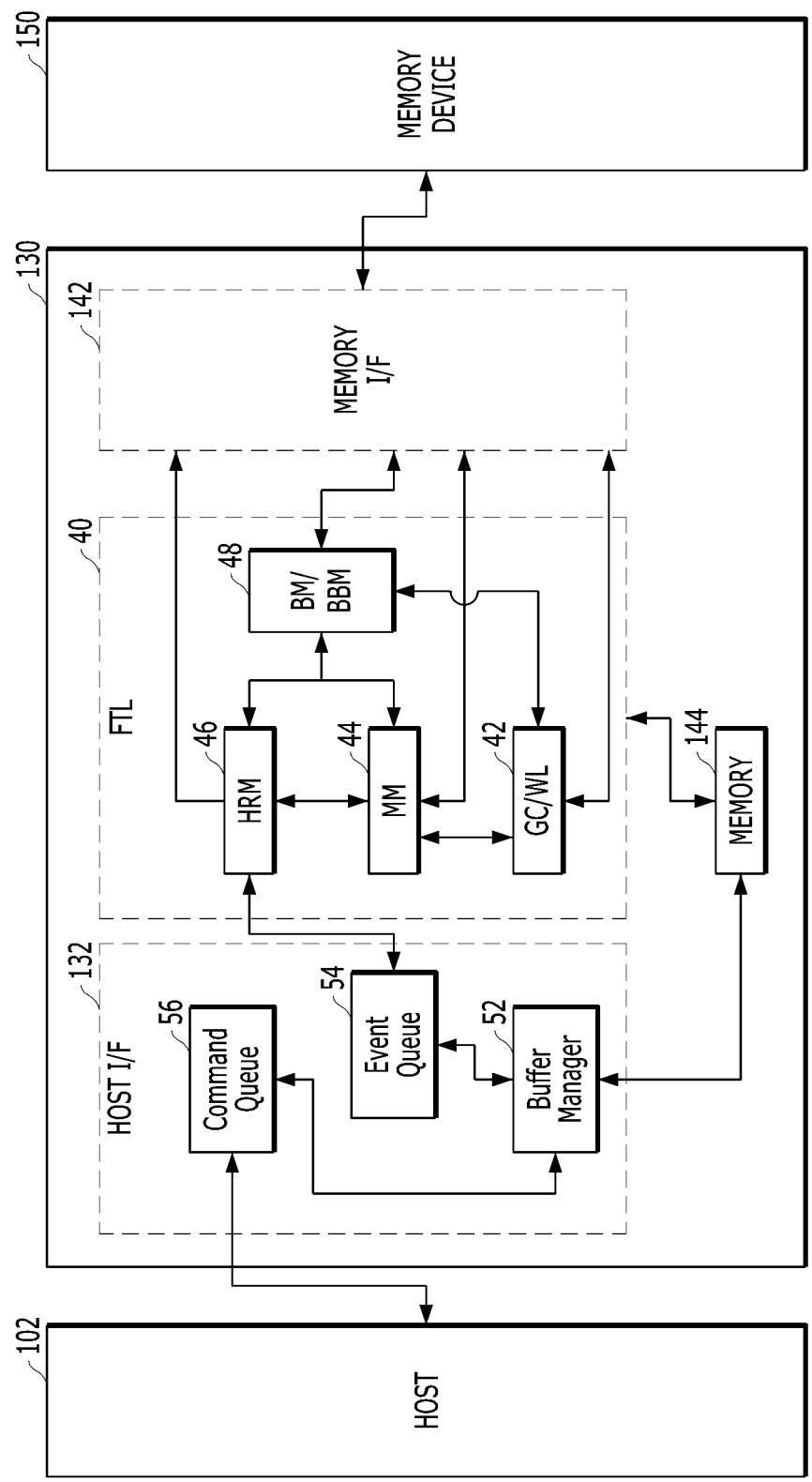
FIG. 3 is a block diagram illustrating a controller in a memory system in accordance with another embodiment of the present invention.

FIG. 3 is a block diagram illustrating a controller in a memory system in accordance with another embodiment of the present disclosure.

Referring to FIG. 3, the controller 130 cooperates with the host 102 and the memory device 150. The controller 130 may include a host interface (I/F) 132, flash translation layer (FTL) circuitry 40, a memory interface (I/F) 142 and a memory 144.

Although not shown in FIG. 3, according to embodiments, the flash translation layer (FTL) circuitry 40 and the host interface 132 may serve as the detection time circuitry A40 included in the operable page check block A37 described with reference to FIG. 1. In addition, according to embodiments, the flash translation layer (FTL) circuitry 40 and the memory interface 142 may serve as the over-read page detection block A31, the alternative operation performance block A32, the backup operation performance block A33, the error check block A34, the read operation performance block A35 and the page list generation circuitry A38 and test operation circuitry A39 included in the operable page check block A37, which are described with reference to FIG. 1.

The host interface 132 may handle commands and data from the host 102. By way of example but not limitation, the host interface 132 may include a command queue 56, a buffer manager 52 and an event queue 54. The command queue 56 may sequentially store commands and data from the host 102 and output them to the buffer manager 52 in a stored order. The buffer manager 52 may classify, manage or adjust commands and data which are delivered from the command queue 56. The event queue 54 may sequentially transmit events for processing the commands and the data, from the buffer manager 52.

A plurality of commands or data having the same characteristics may be continuously received from the host 102, or commands and data having different characteristics may be transmitted to the memory system 110 after being mixed. For example, a plurality of read commands may be delivered, or read commands and program/write commands may be alternately transmitted to the memory system 110. The host interface 132 may sequentially store commands and data, which are received from the host 102, to the command queue 56. Thereafter, the host interface 132 may estimate or predict what kind of internal operation the controller 130 will perform according to the characteristics of the command and data which is received from the host 102. The host interface 132 may determine a processing order and a priority of commands and data, based at least on their characteristics. According to characteristics of commands and data, from the host 102, the buffer manager 52 in the host interface 132 is configured to determine whether the buffer manager 52 should store commands and data in the memory 144, or whether the buffer manager 52 should deliver the commands and the data into the flash translation layer (FTL) circuitry 40. The event queue 54 receives events, entered from the buffer manager 52, which are to be internally executed and processed by the memory system 110 or the controller 130 in response to the commands and the data from the host 102, so as to deliver the events into the flash translation layer (FTL) circuitry 40 in the order received.

In accordance with an embodiment, the host interface 132 in FIG. 3 may perform the functions of the controller 130 in FIG. 2.

In accordance with an embodiment, the flash translation layer (FTL) circuitry 40 may include a state manager (GC/WL) 42, a map manager (MM) 44, a host request manager (HRM) 46, and a block manager (BM/BBM) 48. The host request manager 46 may manage the events entered from the event queue 54. The map manager 44 may handle or control map data. The state manager 42 may perform garbage collection (GC) or wear leveling (WL). The block manager 48 may execute commands or instructions onto a block in the memory device 150.

By way of example but not limitation, the host request manager 46 may use the map manager 44 and the block manager 48 to handle or process requests according to the read and program commands, and events which are delivered from the host interface 132. The host request manager 46 may send an inquiry request to the map data manager 44, to determine a physical address corresponding to the logical address which is entered with the events. The host request manager 46 may send a read request with the physical address to the memory interface 142, to process the read request (handle the events). On the other hand, the host request manager 46 may send a program request (or write request) to the block manager 48, to program entered data to an empty page (i.e., a page having no data) in the memory device 150, and then, may transmit a map update request corresponding to the program request to the map manager 44, to update mapping addresses.

The block manager 48 may convert a program request delivered from the host request manager 46, the map data manager 44, and/or the state manager 42 into a flash program request used for the memory device 150, to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. The block manager 48 may send several flash program requests to the memory interface 142 to enhance or maximize parallel processing of the multi-channel and multi-directional flash controller.

The block manager 48 may be configured to manage blocks in the memory device 150 according to the number of valid pages, select and erase blocks having no valid pages when a free block is needed, and select a block including the least number of valid pages when it is determined that garbage collection is necessary. The state manager 42 may perform garbage collection to move the valid data to an empty block and erase remaining data in the blocks from which the valid data was moved so that the block manager 48 may have enough free blocks. If the block manager 48 provides information regarding a block to be erased to the state manager 42, the state manager 42 is able to check all flash pages of the block to be erased to determine whether each page is valid. To determine validity of each page, the state manager 42 may identify a logical address stored in an out-of-band (OOB) area of each page. To determine whether each page is valid, the state manager 42 may compare the physical address of the page with the physical address mapped to the logical address obtained from the request. The state manager 42 sends a program request to the block manager 48 for each valid page. A mapping table may be updated through the update of the map manager 44 when the program operation is complete.

The map manager 44 may manage a logical-physical mapping table. The map manager 44 may process requests such as queries and updates, which are generated by the host request manager 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

When garbage collection is performed, the state manager 42 copies valid page(s) into a free block, and the host request manager 46 may program the latest version of the data for the same logical address of the page and issue an update request. When the state manager 42 requests the map update in a state in which copying of valid page(s) has not been completed, the map manager 44 may not perform the mapping table update. This is because the map request is issued with old physical information if the state manger 42 requests a map update and a valid page copy is not completed until later. The map manager 44 may perform a map update operation to ensure accuracy only if the latest map table still points to an old physical address.

The memory device 150 may include a plurality of memory blocks. Each of the plurality of memory blocks may be a single level cell (SLC) memory block or a multi level cell (MLC) memory block, according to the number of bits that can be stored or represented in one memory cell of such block. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have a larger storage capacity for the same space compared to the SLC memory block. The MLC memory block can be highly integrated in terms of storage capacity. In an embodiment, the memory device 150 may be implemented with MLC memory blocks, such as a double level cell memory block, a triple level cell (TLC) memory block, a quadruple level cell (QLC) memory block or a combination thereof. The double level memory block may include a plurality of pages implemented by memory cells, each capable of storing 2-bit data. The triple level cell (TLC) memory block may include a plurality of pages implemented by memory cells, each capable of storing 3-bit data. The quadruple level cell (QLC) memory block may include a plurality of pages implemented by memory cells, each capable of storing 4-bit data. In another embodiment, the memory device 150 may be implemented with a block including a plurality of pages implemented by memory cells, each capable of storing 5 or more bits of data.

In an embodiment of the disclosure, the memory device 150 is a nonvolatile memory such as a flash memory such as a NAND flash memory, a NOR flash memory and the like. In another embodiment, the memory device 150 may be at least one of a phase change random access memory (PCRAM), a ferroelectric random access memory (FRAM) and a spin injection magnetic memory (e.g., a spin transfer torque magnetic random access memory (STT-MRAM)).

FIGS. 4A to 4F illustrate an operating method of a memory system in accordance with an embodiment of the present invention.

Figure 4A:
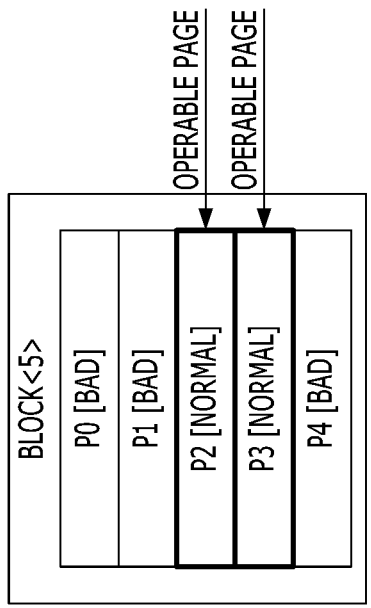
Figure 4A:
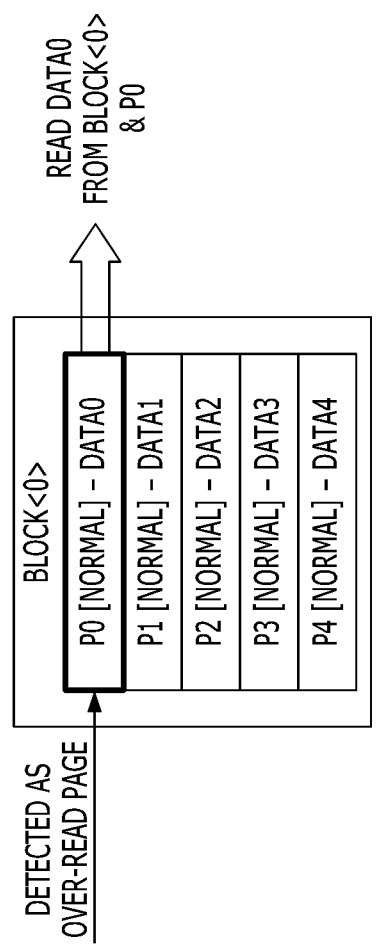

Referring to FIGS. 1 and 4A, the read request may be concentrated on the zeroth page P<0> in the zeroth memory block BLOCK<0> among the plurality of normal memory blocks BLOCK<0:4> in the memory device 150. That is, in this example, the number of read requests made on page P<0> is equal to or greater than the first reference number. Accordingly, the controller 130 may detect the zeroth page P<0> of the zeroth memory block BLOCK<0> as the "over-read page".

In addition, the controller 130 may perform the test operation on the zeroth, first and fourth pages P<0>, P<1> and P<4> among the plurality of pages P<0:4> in the fifth memory block BLOCK<5>, which is a bad memory block in the memory device 150, and thus determine that pages P<0>, P<1> and P<4> are bad pages which are not normally programmable/readable. Similarly, the controller 130 may perform the test operation on the second and third pages P<2> and P<3> in block BLOCK<5>, and thus determine that pages P<2> and P<3> are operable pages which are normally programmable/readable. Accordingly, the controller 130 may generate the page list by grouping the information on the second and third pages P<2> and P<3> of the fifth memory block BLOCK<5> in a list form.

An operational time point of FIG. 4A may be before the controller 130 performs the backup operation of copying the data from the "over-read page" into the "back-up page". Accordingly, the controller 130 may read data DATA0 from the zeroth page P<0> of the zeroth memory block BLOCK<0> in response to the read request for P<0> of BLOCK<0>, which page is detected as the "over-read page".

Figure 4B:
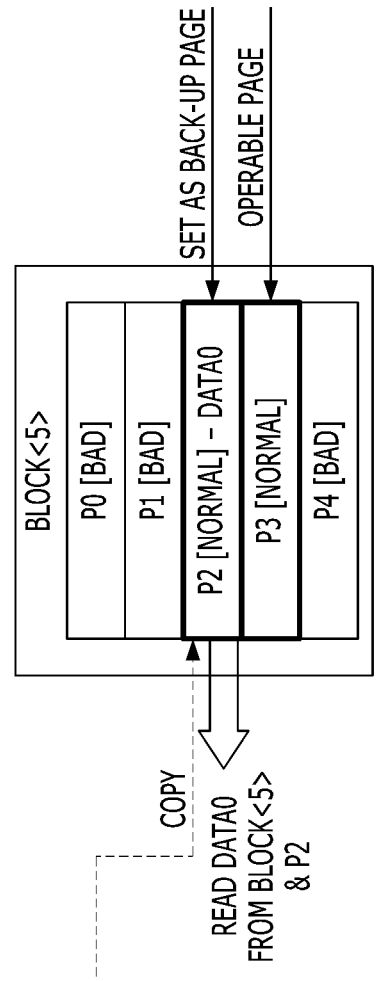
Figure 4B:
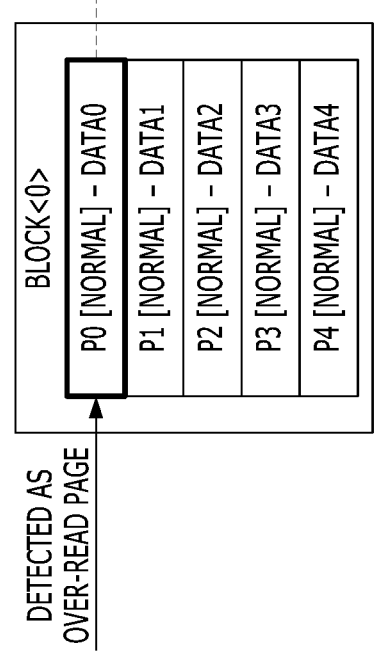

Referring to FIGS. 1 and 4B, after the operational time point of FIG. 4A, the controller 130 may set the back-up page P<2> of the fifth memory block BLOCK<5> as the "back-up page", with reference to the page list. Subsequently, the controller 130 may perform the backup operation of copying the data from the "over-read page" into the "back-up page". In other words, the controller 130 may copy the data DATA0 stored in the zeroth page P<0> of the zeroth memory block BLOCK<0>, which is detected as the "over-read page", into the back-up page P<2> of the fifth memory block BLOCK<5>, which is set as the "back-up page".

After performing the backup operation as above, the controller 130 may read the data DATA0 from the back-up page P<2> of the fifth memory block BLOCK<5>, which is set as the "back-up page", in response to the read request for the zeroth page P<0> of the zeroth memory block BLOCK<0>, which is detected as the "over-read page".

Referring to FIGS. 1, 4C and 4D, after an operational time point of FIG. 4B, errors equal to or greater in number than a reference value may occur when the controller 130 reads the data DATA0 from the back-up page P<2> of the fifth memory block BLOCK<5>, which is set as the "back-up page", in response to the read request for the zeroth page P<0> of the zeroth memory block BLOCK<0>, which is detected as the "over-read page". In other words, the data DATA0 may not be normally read from the back-up page P<2> of the fifth memory block BLOCK<5>, which is set as the "back-up page".

In this circumstance, the controller 130 may abandon the read operation on the back-up page P<2> of the fifth memory block BLOCK<5>, which is set as the "back-up page", and instead read the data DATA0 from the zeroth page P<0> of the zeroth memory block BLOCK<0>, in order to preferentially process the read request for the zeroth page P<0> of the zeroth memory block BLOCK<0>, which is detected as the "over-read page".

Subsequently, referring to FIG. 4D, the controller 130 may cancel the setting of the back-up page P<2> of the fifth memory block BLOCK<5>, from which the data DATA0 has not been normally readable at an operational time point of FIG. 4C, as the "back-up page". In addition, the controller 130 may invalidate the back-up page P<2> of the fifth memory block BLOCK<5>, from which the data DATA0 has not been normally readable at the operational time point of FIG. 4C. The controller 130 may erase information on the back-up page P<2> of the fifth memory block BLOCK<5> from the page list. In this circumstance, when the read request occurs for the zeroth page P<0> of the zeroth memory block BLOCK<0>, which is detected as the "over-read page", the controller 130 may read the data DATA0 from the zeroth page P<0> of the zeroth memory block BLOCK<0>.

Subsequently, the controller 130 may set the third page P<3> of the fifth memory block BLOCK<5> as the "back-up page", with reference to the page list. The controller 130 may perform the backup operation of copying the data from the "over-read page" into the "back-up page". In other words, the controller 130 may copy the data DATA0 stored in the zeroth page P<0> of the zeroth memory block BLOCK<0>, which is detected as the "over-read page", into the third page P<3> of the fifth memory block BLOCK<5>, which is set as the "back-up page".

After performing the backup operation as described above, the controller 130 may read the data DATA0 from the third page P<3> of the fifth memory block BLOCK<5>, which is set as the "back-up page", in response to the read request for the zeroth page P<0> of the zeroth memory block BLOCK<0>, which is detected as the "over-read page".

Referring to FIGS. 1, 4E and 4F, after an operational time point of FIG. 4D, errors equal to or greater in number than a reference value may occur when the controller 130 reads the data DATA0 from the third page P<3> of the fifth memory block BLOCK<5>, which is set as the "back-up page", in response to the read request for the zeroth page P<0> of the zeroth memory block BLOCK<0>, which is detected as the "over-read page". In other words, the data DATA0 may not be normally read from the third page P<3> of the fifth memory block BLOCK<5>, which is set as the "back-up page".

In this circumstance, the controller 130 may abandon the read operation on the third page P<3> of the fifth memory block BLOCK<5>, which is set as the "back-up page", but rather read the data DATA0 from the zeroth page P<0> of the zeroth memory block BLOCK<0>, in order to preferentially process the read request for the zeroth page P<0> of the zeroth memory block BLOCK<0>, which is detected as the "over-read page".

Subsequently, referring to FIG. 4F, the controller 130 may cancel the setting of the third page P<3> of the fifth memory block BLOCK<5>, from which the data DATA0 was not normally readable at an operational time point of FIG. 4E, as the "back-up page". In addition, the controller 130 may invalidate the third page P<3> of the fifth memory block BLOCK<5>, from which the data DATA0 was not normally readable at the operational time point of FIG. 4E. The controller 130 may erase information on the third page P<3> of the fifth memory block BLOCK<5> from the page list. In this circumstance, when the read request occurs for the zeroth page P<0> of the zeroth memory block BLOCK<0>, which is detected as the "over-read page", the controller 130 may read the data DATA0 from the zeroth page P<0> of the zeroth memory block BLOCK<0>.

Subsequently, the controller 130 may check that an operable page is not present in the fifth memory block BLOCK<5> any longer, with reference to the page list. Accordingly, the controller 130 may set, as the "back-up page", the zeroth page P<0> of the first memory block BLOCK<1> including an empty page, among the normal memory blocks BLOCK<0:4>. Subsequently, the controller 130 may perform the backup operation of copying the data from the "over-read page" into the "back-up page". In other words, the controller 130 may copy the data DATA0 stored in the zeroth page P<0> of the zeroth memory block BLOCK<0>, which is detected as the "over-read page", into the zeroth page P<0> of the first memory block BLOCK<1>, which is set as the "back-up page".

After performing the backup operation as above, the controller 130 may read the data DATA0 from the zeroth page P<0> of the first memory block BLOCK<1>, which is set as the "back-up page", in response to the read request for the zeroth page P<0> of the zeroth memory block BLOCK<0>, which is detected as the "over-read page".

Figure 5:
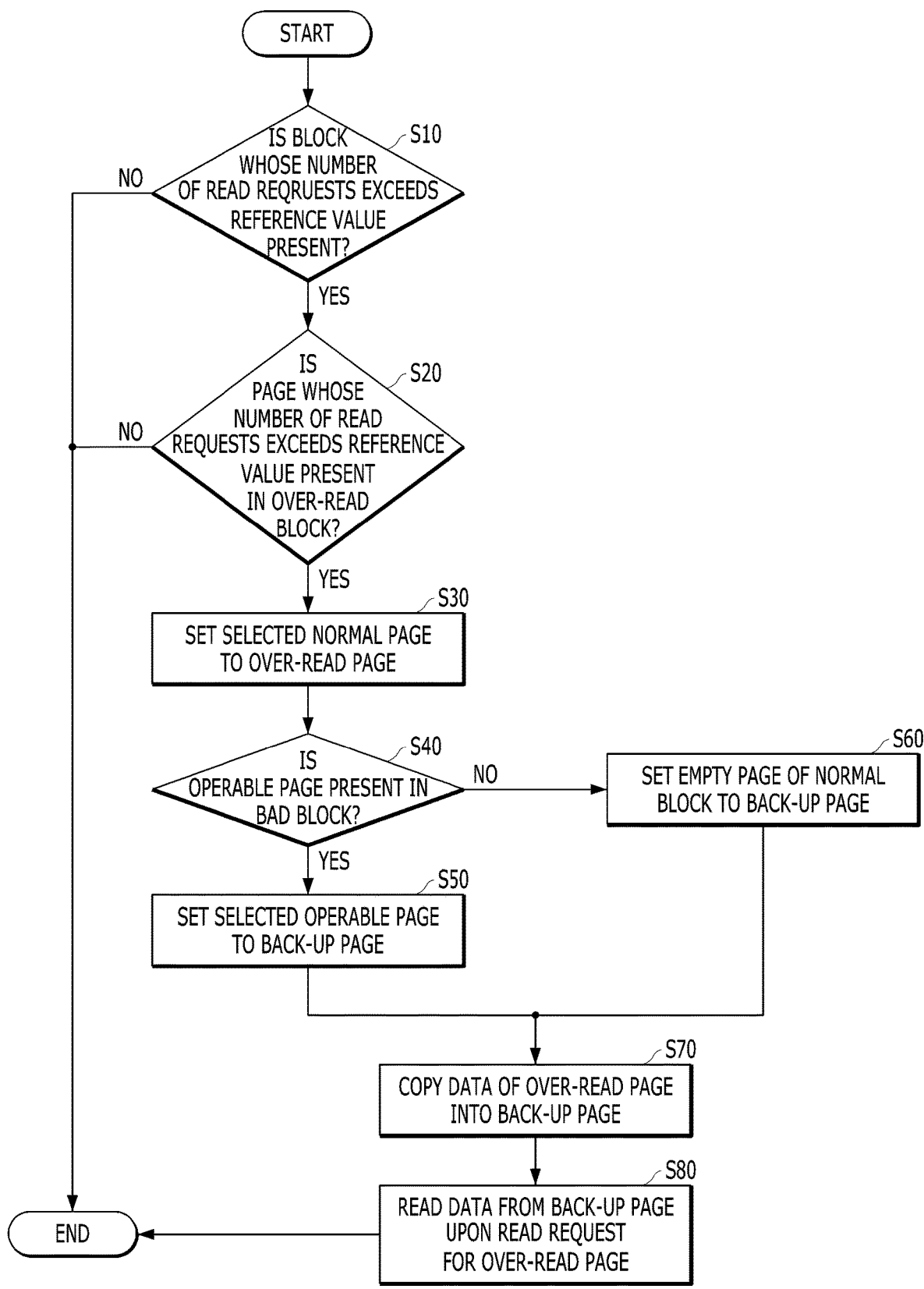
FIG. 5 is a flowchart illustrating an operating method of a memory system in accordance with an embodiment of the present invention.

FIG. 5 is a flowchart illustrating an operating method of a memory system in accordance with an embodiment of the present invention.

Referring to FIGS. 1 and 5, the memory system 110 according to the present embodiment may check whether a block whose number of read requests exceeds the second reference number is present among the plurality of memory blocks BLOCK<0:5> included in the memory device 150, in step S10. When no such block is present among the memory blocks BLOCK<0:5> (that is, "NO" in step S10), the memory system 110 may not perform an additional operation but perform the general operations, that is, the read/write/erase operations. On the contrary, when a block whose number of read requests exceeds the second reference number is present among the memory blocks BLOCK<0:5> (that is, "YES" in step S10), the corresponding block may be defined as an over-read block.

When the operation result of step S10 indicates that the over-read block is present (that is, "YES" in step S10), the memory system 110 may check whether a page whose number of read requests exceeds the first reference number is present among the plurality of pages P<0:4> included in the over-read block, in step S20. When no such page is present among the pages P<0:4> in the over-read block (that is, "NO" in step S20), the memory system 110 may not perform an additional operation but perform the general operations thereof, that is, the read/write/erase operations. On the contrary, when a page whose number of read requests exceeds the first reference number is present among the pages P<0:4> in the over-read block (that is, "YES" in step S20), the corresponding page may be set as the "over-read page" in step 30.

When an "over-read page" is present, among a plurality of pages in a plurality of normal memory blocks BLOCK<0:4>, the memory system 110 may check whether an operable page where data can be normally inputted/outputted is present among the plurality of pages P<0:4> included in the bad memory block BLOCK<5> in step S40.

When the operation result of step S40 indicates that one or more operable pages where data can be normally inputted/outputted are present among the pages P<0:4> in the bad memory block BLOCK<5> (that is, "YES" in step S40), the memory system 110 may select any one of the operable pages and set the selected page as the "back-up page", in step S50.

When the operation result of step S40 indicates that no operable page where data can be normally inputted/outputted is present among the pages P<0:4> in the bad memory block BLOCK<5> (that is, "NO" in step S40), the memory system 110 may select an empty page among the plurality of pages in the normal memory blocks BLOCK<0:4> and set the selected page as the "back-up page", in step S60.

When the back-up page is set through the operation of step S50 or S60, the data may be copied from the "over-read page" into the "back-up page", in step S70.

After the data is copied from the "over-read page" into the "back-up page" through the operation of step S70, the data may be read from the "back-up page" in response to the read request for the "over-read page", in step S80.

As described above, when embodiments of the present disclosure are applied, some pages, on which the read requests are concentrated, among a plurality of pages in a normal memory block may be detected as "over-read pages", data may be copied from the detected "over-read pages" into at least one "back-up page", and then a read request for the "over-read page" may be controlled to be performed on the "back-up page". As the read request directed to concentrated "over-read page(s)" is redirected to, and performed on, the "back-up page", the read request can be stably processed.

In this case, since some pages, on which the read requests are concentrated, among the pages in the normal memory block are detected as "over-read pages", the entire normal memory block may be prevented from being selected as a source block of a read reclaim operation due to read requests being concentrated on some pages of the normal memory block.

In addition, to copy data from the detected "over-read page", a normal page in the bad memory block may be preferentially set and used as the "back-up page". Accordingly, when the "back-up page" is set to copy data of the detected "over-read page" for which read is requested, an empty page of the normal memory block may be used at a minimum.

The effects of the system according to embodiments of the present disclosure are described as follows.

The memory system according to embodiments of the present disclosure may detect a read request concentrated on some pages, distribute and store data from the detected pages into another page, and then control the data to be distributed and read in the another page, thereby stably processing the concentrated read request for the detected pages. Therefore, it is possible to prevent a read reclaim operation from being performed on a block including the detected pages.

In addition, when distributing and storing data from the pages on which the read requests are concentrated, the memory system preferentially uses normal pages in a bad memory block, thereby minimizing the use of a normal memory block for distributing and reading the requested data.

While the present disclosure has been illustrated and described with respect to specific embodiments, it will be apparent to those skilled in the art that various changes and modifications may be made without departing from the spirit and scope of the disclosure as defined in the following claims. The present invention encompasses all such changes and modifications that fall within the scope of the claims.

What is claimed is:

1. A memory system comprising:
a nonvolatile memory device including a plurality of memory blocks each including a plurality of pages, wherein the plurality of memory blocks include at least one bad block and normal block; and
a controller suitable for performing a backup operation of copying data from an over-read page into a back-up page when the over-read page, a number of read requests to which is equal to or greater than a first reference number, is detected among the plurality of pages in the normal block, and reading the data from the back-up page in response to a read request for the over-read page after the backup operation,
wherein the controller is further suitable for performing an operation of setting a page which is programmable/readable as the back-up page, and not using a page which is unprogrammable/unreadable, among the plurality of pages in the bad block.

2. The memory system of claim 1, wherein, when a number of errors equal to or greater than a reference value occur when reading the data from the back-up page in response to the read request for the over-read page, the controller reads the data from the over-read page, invalidates the back-up page, and performs an operation of canceling the setting of a page set as the back-up page.

3. The memory system of claim 2, wherein after the canceling operation, the controller sets an empty page, among the plurality of pages in the normal block, as the back-up page when no page which is programmable/readable is present among the plurality of pages in the bad block.

4. The memory system of claim 1,
wherein the controller detects at least one page which is programmable/readable, among the plurality of pages in the bad block, during a detection time period, and generates a page list including the detected page, and
wherein the controller sets at least one among the detected page included in the page list as the back-up page.

5. The memory system of claim 4,
wherein the controller detects the page which is programmable/readable by performing a test operation of programming/reading dummy data in each of the pages in the bad block, and
wherein the controller detects, as the page which is programmable/readable, a page whose number of errors is less than or equal to a reference number of errors as a result of performing the test operation.

6. The memory system of claim 5, wherein the controller enters the detection time period when a command is not inputted from a host for a reference time or more, and exits from the detection time period in response to a command inputted from the host.

7. The memory system of claim 1, wherein the controller sets an empty page, among the plurality of pages in the normal block, as the back-up page when no programmable/readable page is present among the plurality of pages in the bad block.

8. The memory system of claim 1,
wherein the controller selects memory blocks whose number of read requests in units of blocks is equal to or greater than a second reference number, from the plurality of memory blocks, and detects the over-read page among a plurality of pages in any one of the selected normal blocks, and
wherein the first reference number is smaller than or equal to the second reference number.

9. The memory system of claim 1,
wherein the controller selects memory blocks whose number of read requests in units of blocks is equal to or greater than a second reference number, from the plurality of memory blocks, detects a candidate page whose number of read requests is equal to or greater than a third reference number—among a plurality of pages in any one of the selected memory blocks, and detects the candidate page as the over-read page when the number of read requests to the candidate page is equal to or greater than the first reference number, and
wherein the third reference number is smaller than the first reference number, and the first reference number is smaller than or equal to the second reference number.

10. An operating method of a memory system that includes a nonvolatile memory device including a plurality of memory blocks each including a plurality of pages, the operating method comprising:
dividing the plurality of memory blocks into at least one bad block and normal blocks;
detecting, in a first detection operation, an over-read page whose number of read requests is equal to or greater than a first reference number, among a plurality of pages in each of the normal blocks;

setting, in a first setting operation, a page which is programmable/readable as a back-up page, and not using a page which is unprogrammable/unreadable, among a plurality of pages in the bad block; and copying data from the over-read page into the back-up page, and then reading the data from the back-up page in response to the read request for the over-read page.

11. The operating method of claim 10, further comprising:

reading the data from the over-read page when a number of errors that occur in the copying of the data is equal to or greater than a reference value; and invalidating the back-up page and then canceling the setting of a page set as the back-up page after the reading of the data from the over-read page.

12. The operating method of claim 11, further comprising setting, in a second setting operation, an empty page, among the plurality pages in a normal block, as the back-up page when no programmable/readable page is present among the plurality of pages in the bad block, after the invalidating of the back-up page.

13. The operating method of claim 10, further comprising:

detecting, in a second detection operation, at least one page which is programmable/readable, among the plurality of pages in the bad block, during a detection time period, and generating a page list including the detected page, wherein, in the first setting operation, at least one among the detected page included in the page list is set as the back-up page.

14. The operating method of claim 13, wherein the second detection operation includes:

detecting, the page which is programmable/readable by performing a test operation of programming/reading dummy data set in each of the pages in the bad block; and detecting, in a third detection operation, as the page which is programmable/readable, a page in which a set number of errors or less occurred as a result of performing the test operation.

15. The operating method of claim 14, further comprising:

entering the detection time period when a command is not inputted from a host for a reference time or more; and exiting from the detection time period in response to the command inputted from the host.

16. The operating method of claim 10, further comprising setting, in a third setting operation, an empty page, among the plurality of pages in a normal block, as the back-up page when no programmable/readable page is present among the plurality of pages in the bad block.

17. The operating method of claim 10, wherein the first detection operation includes:

selecting memory blocks whose number of read requests in units of blocks is equal to or greater than a second reference number among the plurality of memory blocks; and detecting the over-read page among a plurality of pages included in any of the selected memory blocks, and wherein the first reference number is smaller than or equal to the second reference number.

18. The operating method of claim 11, wherein the first detection operation includes:

selecting memory blocks whose number of read requests in units of blocks is equal to or greater than a second reference number, among the plurality of memory blocks;

detecting a candidate page, to which a number of read requests is equal to or greater than a third reference number, among a plurality of pages in any one of the selected memory blocks; and detecting the candidate page as the over-read page when the number of read requests to the candidate page is equal to or greater than the first reference number, and wherein the third reference number is smaller than the first reference number, and the first reference number is smaller than or equal to the second reference number.

19. A memory system comprising:

a memory device including first and second blocks having first and second pages respectively; and a controller suitable for controlling the memory device to:

copy data from the first page into the second page, when the first page has been read more than a threshold number of times; and read the data from the second page in response to a read request for the first page, wherein the second page is a page which is programmable/readable among a plurality of pages in the second block which is detected as a bad block, and wherein a page which is unprogrammable/unreadable among the plurality of pages in the second block is not used.

20. The memory system of claim 19, wherein the controller is suitable for controlling the memory device to read the data from the first page, when the reading of the data from the second page fails.

* * * * *